US005382898A

United States Patent [19]

Subramanian

[11] Patent Number: 5,382,898

[45] Date of Patent: Jan. 17, 1995

[54] HIGH DENSITY PROBE CARD FOR TESTING ELECTRICAL CIRCUITS

[75] Inventor: Eswar Subramanian, Phoenix, Ariz.

[73] Assignee: Cerprobe Corporation, Tempe, Ariz.

[21] Appl. No.: 947,935

[22] Filed: Sep. 21, 1992

[51] Int. Cl.[6] .............. G01R 31/02

[52] U.S. Cl. .............. 324/754; 324/158.1; 324/72.5

[58] Field of Search .............. 324/158 F, 158 P, 72.5, 324/574; 439/82

[56] References Cited

U.S. PATENT DOCUMENTS

| | | | |
|---|---|---|---|
| 3,835,381 | 9/1974 | Garretson et al. | 324/158 |
| 3,905,098 | 9/1975 | Garretson et al. | 29/628 |
| 4,480,223 | 10/1984 | Aigo | 324/158 |
| 4,523,144 | 6/1985 | Okubo et al. | 324/158 |
| 4,593,243 | 6/1986 | Lao et al. | 324/158 |
| 4,599,559 | 7/1986 | Evans | 324/158 |
| 4,636,722 | 1/1987 | Ardezzone | 324/158 |
| 4,707,656 | 11/1987 | Marzan | 324/158 F |
| 4,712,062 | 12/1987 | Takamine | 324/158 F |
| 4,719,417 | 1/1988 | Evans | 324/158 |
| 4,727,319 | 2/1988 | Shahriary | 324/158 F |
| 4,731,577 | 3/1988 | Logan | 324/158 P |
| 4,757,256 | 1/1988 | Whann et al. | 324/149 |
| 4,827,211 | 5/1989 | Strid et al. | 324/158 |
| 4,837,622 | 6/1989 | Whann et al. | 324/158 |
| 4,968,589 | 11/1990 | Perry | 430/314 |
| 4,983,907 | 1/1991 | Crowley | 324/158 |
| 5,061,894 | 10/1991 | Ikeda | 324/158 |
| 5,066,907 | 11/1991 | Tarzwell et al. | 324/158 |

*Primary Examiner*—Vinh Nguyen
*Attorney, Agent, or Firm*—Cahill, Sutton & Thomas

[57] ABSTRACT

A probe card formed of a printed circuit board having an opening therein and having a ground plane formed on the lower surface thereof. A ground strip formed of aluminum is secured to the printed circuit board and positioned adjacent the opening and in electrical contact with the ground plane. The strip includes a support surface for supporting a plurality of probes extending along and parallel to the surface and secured thereto by insulating means to maintain a predetermined distance from the support surface. The probes extend into the opening for making temporary electrical contact with a circuit to be tested.

13 Claims, 2 Drawing Sheets

15 2 10 12 20 22 14 28 18 38 35 30 25 31 26 21 39 2

HIGH DENSITY PROBE CARD FOR TESTING ELECTRICAL CIRCUITS

FIELD OF THE INVENTION

The present invention relates to the field of circuit testing, and more particularly to systems incorporating probes for making temporary electrical contact during the testing of circuits such as integrated circuits and the like.

BACKGROUND OF THE INVENTION

In the manufacture of integrated circuits (IC's), integrated circuit packaging, IC wafers and multi-chip modules, it is necessary to test the circuits as part of the manufacturing process. The testing is performed by creating a temporary electrical contact between a test probe or probes with selected points on the circuit under test. A predetermined programmed test is then undertaken utilizing signals applied to the circuit and derived therefrom through the probes. As development of circuits and circuit manufacturing technique has progressed, the number of required probe contacts has substantially increased and the frequencies at which the circuits are tested has increased. The combination of high probe numbers and high frequency subjects the probe card and probe design to significant limitations.

One of the techniques for mounting test probes is the utilization of an epoxy ring-style probe card constructed in a manner similar to printed circuit boards and incorporating an opening surrounded by probes depending from the card or board. The circuit under test is then raised into contact with the depending probes with the individual probes contacting predetermined contact pads on the circuit to be tested. The mounting of the probes on the probe card and the interconnection of such probes to contact pads or points on the probe card to permit the probes to be connected to test circuitry has resulted in numerous prior art design concepts.

The high frequency used for such probing limits the applicability of epoxy ring-style probe cards since such probe cards typically incorporate uncontrolled impedance paths, possibly as long as several inches, on the probe card. Wire probes, with lumped parasitic inductance of up to 20nH severely degrades signal fidelity above 50MHz due to cross-talk and signal attenuation.

OBJECTS OF THE INVENTION

It is therefore an object of the present invention to provide an improved probe card incorporating high probe density without the adverse affects of high frequencies experienced in prior art probe cards.

It is another object of the present invention to provide a high density probe card employing an impedance controlling structure to minimize the adverse affects of higher frequencies.

It is still another object of the present invention to provide a high density probe card incorporating in ground plane directly beneath the probes of the card with the probes secured to a grounded structural member and spaced from the grounded member at a predetermined distance.

These and other objects of the present invention will become apparent to those skilled in the art as the description thereof proceeds.

SUMMARY OF THE INVENTION

Briefly, in accordance with the embodiment chosen for illustration, a probe card having upper and lower parallel surfaces is provided with a ground plane formed on the lower surface thereof. A centrally disposed circular opening extends through the probe card and is provided with an aluminum ground strip formed into a ring circumscribing the opening and extending into the opening to form a support ring adjacent the lower surface of the card. The ground strip is in electrical contact with the ground plane and includes a lower surface formed to support a plurality of probes extending substantially radially inwardly of the circular opening, each probe terminating in a probe tip for contacting a circuit to be tested. The probes are mounted parallel to the lower surface of the ground strip and are carefully positioned a predetermined distance therefrom. The probes are supported by the ground strip and are insulated therefrom through the utilization of an encapsulant such as an epoxy which maintains the spacing between the surface of the ground strip and the probes. The probes, thus positioned and maintained at a predetermined distance from the ground strip, form a wire-over-ground transmission line that provides a matched impedance transmission line exhibiting a desired characteristic impedance. The wire-over-ground transmission line technique is continued as the extends away from the circular opening to a designated solder point positioned remote from the probe tips; the transmission line technique is provided by an insulating sleeve surrounding the probe as it extends from the ground strip to a solder point. The ground plane extends from the ground strip to the immediate vicinity of the solder point.

BRIEF OF DESCRIPTION OF THE DRAWINGS

The present invention may more readily be described by reference to the accompanying drawings in which.

DETAILED DESCRIPTION OF THE PREFERRED EMBODIMENT

Figure 1:
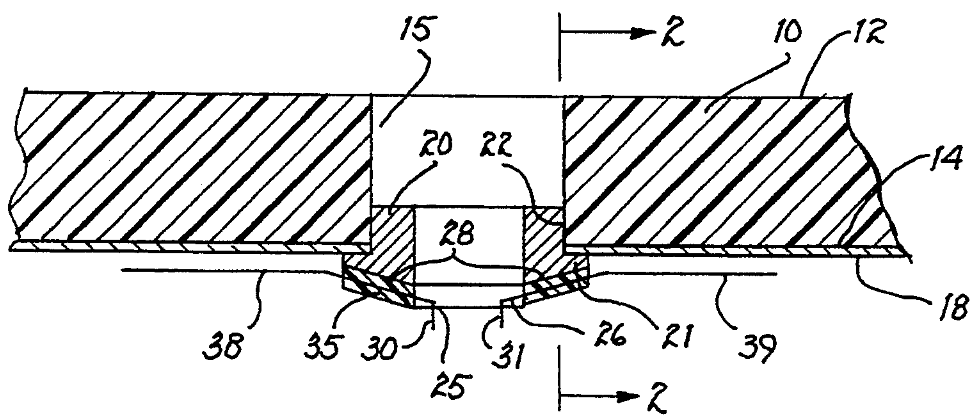
FIG. 1 is a cross-sectional view of a portion of a probe card constructed in accordance with the teachings of the present invention.

Referring to FIG. 1, a cross-section of a high density probe card constructed in accordance with the teachings of the present invention is shown. The probe card 10 may be formed using well known techniques typically found in printed circuit board manufacture. The probe card or circuit board is formed of a rigid insulating material and is generally planar with upper and lower substantially parallel surfaces 12 and 14, respectively. A centrally disposed circular opening 15 extends through the probe card. The lower surface 14 has a ground plane 18 formed thereon; the ground plane 18 may be formed using conventional printed circuit board techniques such as laminating a thin layer of copper superimposed by successive layers of nickel and gold.

The ground plane 18 may best be formed in a continuous sheet, although it may be possible to form the ground plane into rings concentrically positioned about the circular opening 15. The present invention, however, is directed to the utilization of a ground plane 18 in combination with a ground strip as more fully described below. It may also be noted that the opening 15 may under certain circumstances be other than round and may instead conform to a particular desired shape dictated by the device or circuit under test; further, the present invention may be embodied in a probe card having probes mounted along a straight edge or mounted on probe cards using the well known wedge configuration. It may also be possible to imbed the ground plane 18 slightly beneath the surface 14 of the probe card 10. To accomplish the purposes of the present invention, such internal ground plane must be placed very close to the surface to provide the appropriate characteristic impedance of the test probes in a manner to be described.

A ground strip 20 formed into a ring is supported by the probe card and extends into the opening 15 with shoulders 21 surrounding or circumscribing the opening and in intimate electrical abutting contact with the ground plane 18. The ground strip 20 is metallic and preferably formed of aluminum. The electrical contact between the ground strip 20 and the ground plane 18 may be achieved by the abutting contact between the shoulder and the ground plane surface 21 or by the edge contact of the ground plane 18 with the circumferential surface 22 of the ground strip. In some instances, and to insure the grounding of the strip 20, it may be desirable to provide a dedicated conductor or wire (not shown) connected such as by soldering to the ground strip 20 and having an opposite end of the conductor secured to the ground plane 18 or a mutual ground point or location.

A plurality of probes, such as those shown at 25 and 26, are positioned a predetermined distance from the lower surface 28 of the ground strip 20. The lower surface 28 is a support surface to which the probes may be secured in a manner to be described. The probes when secured to the support surface or lower surface 28 are parallel to the surface. It may be noted that the ground strip lower surface 28 is sloped to angle the probes downwardly to conveniently position the probe tips 30 and 31 to enable them to conveniently contact a device or circuit to be tested. For purposes of simplicity of the illustration, only two probes 25 and 26 are shown; however, it will be obvious to those skilled in the art that in practice a complete array of probes will normally be utilized and are frequently arranged to extend radially inwardly toward the center of the circular opening 15. The specific length of each probe as well as its exact positioning depends on the contact pattern of the pads contained on the device or circuit to be tested.

The probes are maintained a predetermined distance from the lower surface 28 of the ground strip 20, and are supported and held in that position through the utilization of an encapsulating material 35. That is, the probes 25 and 26 are positioned relative to the lower surface 28 of the ground strip 20, and those positions are fixed by encasing the probes with a material such as epoxy to thereby fix the distance from the probes to the lower ground strip surface. The encapsulating material may be conventional epoxy material utilized in probe card manufacture. Such epoxies frequently are combinations of epoxy resin binders with ceramic fillers. The encapsulant is an insulating material thus insulating the ground strip 20 from the probes while acting as a means for securing the probes to be supported by the ground strip 20.

The outer stretches 38 and 39 of the probes 25 and 26, respectively, are maintained a predetermined distance from the ground plane 18 through the use of insulating sleeves to insulate the probes from the ground plane 18 and from each other; alternatively, if the ground plane is imbedded as described previously, then the utilization of a sleeve may not be necessary. The outer stretches 38 and 39 of the probes 25 and 26 extend to appropriate solder or connecting points on the outer portions of the probe card 10 in a manner well known in the prior art.

Figure 2:
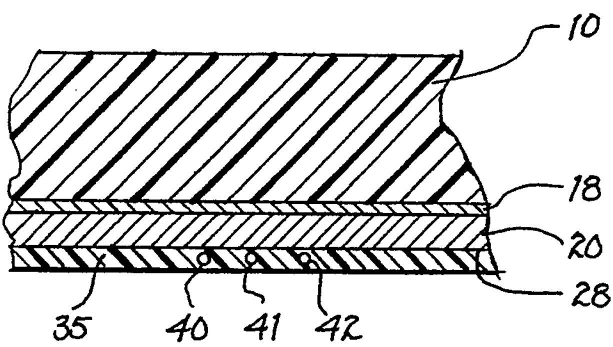
FIG. 2 is a cross-sectional view of a portion of FIG. 1 taken along line 2—2.
Figure 3:
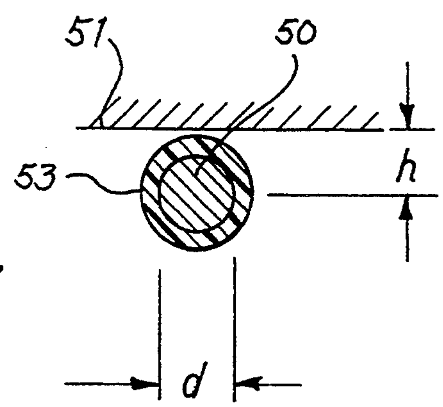
FIG. 3 is a schematic drawing of a conductor positioned at a prescribed distance from a ground plane useful for describing the present invention.

Referring to FIG. 2, the positioning of the probes may more clearly be seen with respect to the ground strip. The probe card 10 is provided with the ground plane 18 which is electrically connected to the ground strip 20 such as by abutting electrical contact. In FIG. 2, three sample probes are shown at 40, 41 and 42. It may be seen that these probes are secured to the ground strip 20 and are accurately spaced from the lower surface 28 through the use of the encapsulative material 35. The positioning of the probes at a predetermined distance from the lower surface of the ground strip effectively eliminates a substantial length of uncontrolled impedance path found on prior art probe cards. That is, the length of the probes adjacent to but spaced from the ground strip provide a predetermined characteristic impedance that may be designed to provide a matched impedance transmission line. In this manner, the uncontrolled impedance path on former probe cards has been eliminated and is provided with a means for matching the characteristic impedance of the probes to that of the printed circuit board or probe card. Referring to FIG. 3, a model of the positioning of a probe in relation to the lower grounded surface of the ground strip is shown. A probe 50 is shown comprising a cylindrical wire having a diameter "d" which is positioned a distance "h" measured from the center of the wire to the ground surface 51. The distance "h" may be selected and is maintained through the encapsulation of the probe in the insulating epoxy material. The equation that describes the characteristic impedance for the probe wire 50 over ground is:

$$Z = \frac{60}{\sqrt{e_r}} \ln\left(\frac{4h}{d}\right)$$

where $Z_o$=characteristic impedance $e_r$=dielectric constant h=distance between ground and center of wire d=wire diameter In a typical application, probes are used having a 10 mil diameter which are positioned approximately 7.5 mils from the center of the probe to the grounding surface. Under such circumstances, measurements indicated that the probes form transmission lines with characteristic impedance that range from 50 to 60 ohms. Under some circumstances, very high density probe cards are utilized having multiple tiers of circular probe arrays. That is, the array of probes as shown in FIG. 1 would be supplemented by a second array positioned beneath the first array. Under such circumstances, the second tier of probes would obviously be further from the lower surface 28 of the ground ring 20; therefore, the characteristic impedance for the second tier would be different; however, it was found that the provision of the ground ring resulted in a characteristic impedance of both tiers of such two tiered arrays to be within an acceptable range.

The insulating sleeve 53 is utilized to insulate the probe from the ground plane 18 as the probe wire extends from the epoxy encapsulation 35 to the point of its connection (not shown) elsewhere on the probe card such as a contact pad or the like. As mentioned previously, the thickness of the sleeve may be selected to provide a matched impedance as the probe wire extends over the surface of the ground plane 18. Alternatively, the ground plane may be imbedded slightly beneath the lower surface of the card to provide appropriate insulation from the probe wire and to provide proper characteristic impedance.

Figure 4:
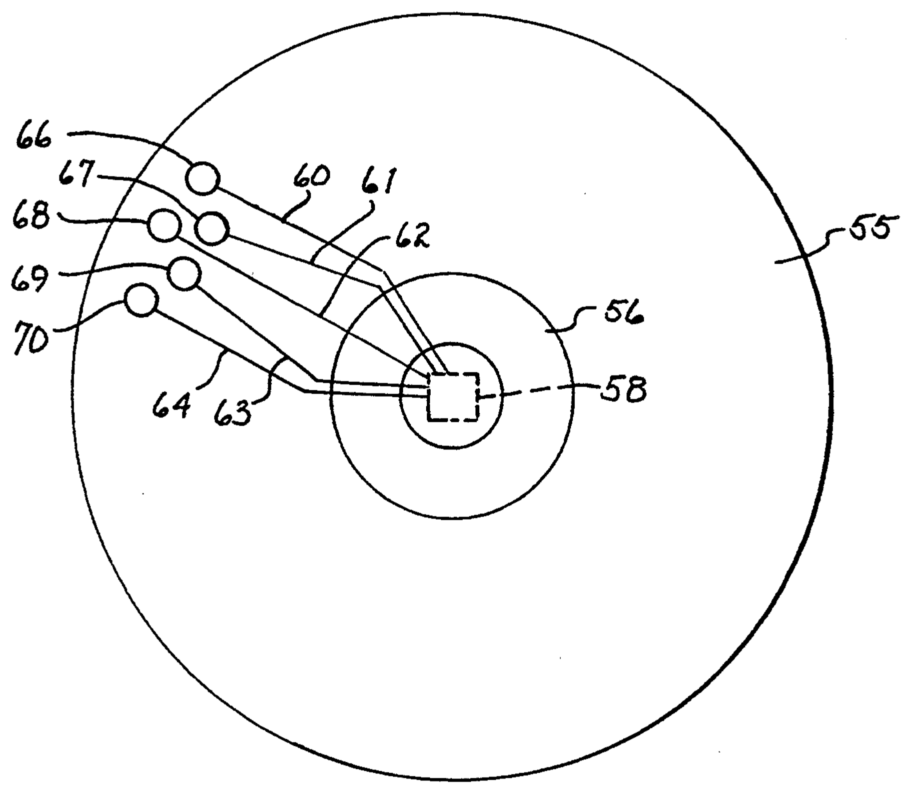
FIG. 4 is a bottom view of a probe card constructed in accordance with the teachings of the present invention showing a sample probe arrangement.

Referring now to FIG. 4, the bottom of an epoxy ring probe is shown wherein the lower surface 55 forms a ground plane in the manner described above. The ground strip 56 is arranged in abutting electrical contact with the ground plane 55 in the manner described above in connection with FIG. 1. An integrated circuit wafer 58 is shown in phantom to facilitate the description of the position of the probes 60–64. It may be seen that each of the probes extends from a contact point at a pad on the wafer 58 in approximate radial direction over the ground strip 56. As described above, this portion of the probe is secured to, supported by, and positioned a predetermined distance from the ground strip 56. As the respective probes extend beyond the ground strip 56, they pass over the ground plane 55 and are maintained a predetermined distance therefrom through the utilization of an insulating sleeve. Each of the probes 60–64 terminates at a solder point 66–70, respectively.

Figure 5:
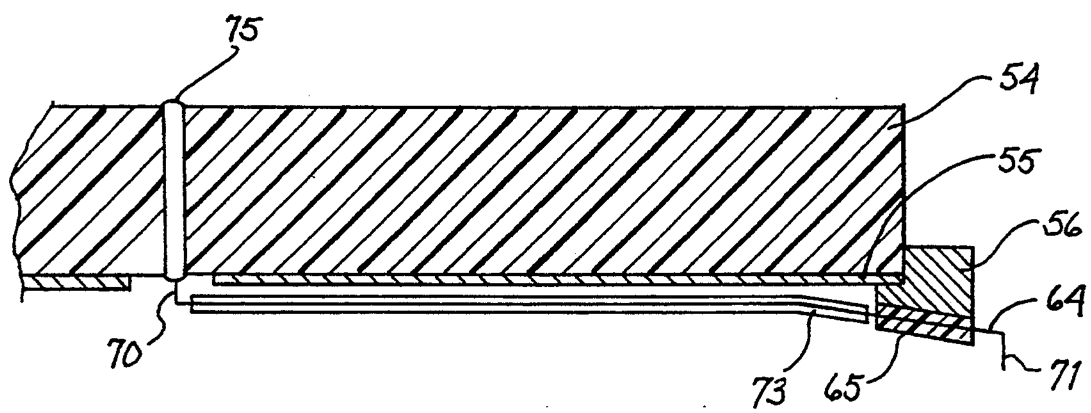
FIG. 5 is a cross-sectional view of a portion of a probe card useful in describing the present invention.

Referring to FIG. 5, the probes of FIG. 4 may be seen with greater particularity. The epoxy probe card 54 includes the ground plane 55 which is in abutting electrical contact with the ground strip 56. The probe 64 is supported by and insulated from the ground strip 56 through the utilization of an epoxy encapsulant 65. As the probe extends from the ground strip 56 in a direction away from the probe tip 71, it is insulated from the ground plane by a probe sleeve 73. The probe then extends over the ground plane to a solder point 70 where it may be soldered to a plated through-hole 75 for ultimate connection to circuitry remote from the probe tip.

The distance between the probe 73 and the ground plane 55 as the former extends from the ground strip to the solder point 70 is maintained by the thickness of the sleeve 73. The same equation for determining characteristic impedance is used, although the dielectric constant to the sleeve 73 will be different than the dielectric constant for the encapsulant, therefore suggesting different spacing or distance between the probe and ground. It may seen by reference to FIG. 4 that when a very large number of probes are to be utilized, the solder points for each of the probes must be positioned a greater distance from the probe card center to provide enough room for the respective solder connections. That is, the length of the respective probes becomes longer as the greater number of probes are used; in high density probe cards, it is this required extended length of the individual probes that can present difficulties at higher frequencies. It thus may be seen that the utilization of the present invention permits the longer probes to be used, and thus higher densities to be used, without the limitations imposed by higher frequencies. The wire-over-ground characteristic impedance of this transmission line approach provides a design characteristic impedance chosen to greatly minimize AC limitations.

The utilization of the ground plane and the ground strip as described above results in a significant improvement in the bandwidth of the probe card. The use of probe sleeves in combination with the ground strip provides wire-over-ground transmission line characteristics in high density, high speed probe cards. The present invention therefore provides an epoxy ring-style probe card for high speed, high density probing applications exhibiting substantially improved AC performance characteristics. The improved probe card exhibits an order of magnitude higher signal bandwidth than prior art epoxy ring-style probe cards.

What is claimed is:

1. A probe card comprising:

(a) a planar printed circuit board having upper and lower substantially parallel surfaces, and having an opening extending therethrough;

(b) said lower surface having a ground plane formed thereon;

(c) a ground strip secured to said printed circuit board and positioned in said opening adjacent said ground plane and having a support surface;

(d) means electrically connecting said ground strip to said ground plane;

(e) a plurality of probes, each extending into said opening for making temporary electrical contact with a circuit to be tested, each probe extending along and parallel to said support surface and positioned a predetermined distance therefrom; and (f) electrical insulating means securing said probes to said support surface to electrically insulate said probes from said ground strip and to maintain said predetermined distance.

2. The combination set forth in claim 1 wherein said opening is circular and is centrally disposed in said circuit board and said ground strip is positioned in said opening in physical and electrical contact with said ground plane.

3. The combination set forth in claim 2 wherein said ground strip is an aluminum ring extending along the bottom of said opening in electrical contact with said ground plane.

4. The combination set forth in claim 1 wherein said electrical insulating means comprises an encapsulant for encapsulating said probes and securing said probes to said support surface at a predetermined distance therefrom.

5. The combination set forth in claim 4 wherein said encapsulant is an epoxy based encapsulant.

6. The combination set forth in claim 1 wherein said support surface is tapered for positioning probes at an angle with respect to the lower surface of said circuit board and wherein said tapered surface supports said probes at a predetermined distance therefrom.

7. The combination set forth in claim 1 wherein said ground plane is embedded beneath the lower surface of said circuit board.

8. A probe card comprising:

(a) a planar printed circuit board having upper and lower substantially parallel surfaces, and having a centrally disposed circular opening extending through said board and surfaces;

(b) said lower surface having a copper based layer formed thereon to provide a ground plane;
(c) an aluminum ground strip secured to said printed circuit board and positioned in abutting electrical contact with said ground plane in said opening and having a portion circumscribing said opening, said strip including a support surface;
(d) a plurality of probes, each extending into said opening for making temporary electrical contact with a circuit to be tested, each probe extending along and parallel to said support surface and positioned a predetermined distance therefrom; and
(e) an epoxy encapsulant securing said probes to said support surface to electrically insulate said probes from said ground strip and to maintain said predetermined distance.

9. The combination set forth in claim 8 wherein said support surface is tapered for positioning said probes at an angle with respect to the lower surface of said circuit board.

10. The combination set forth in claim 8 wherein said ground plane is imbedded beneath the lower surface of said probe card to insulate probe extensions extending along the lower surface of said circuit board.

11. A probe card comprising:
(a) a planar printed circuit board having upper and lower substantially parallel surfaces;
(b) said lower surface having a ground plane formed thereon;
(c) a ground strip secured to said printed circuit board and positioned adjacent said ground plane and having a support surface;
(d) means electrically connecting said ground strip to said ground plane;
(e) a plurality of probes each having a probe tip and each extending from said probe card for making temporary electrical contact with a circuit to be tested, each probe extending along and parallel to said support surface and positioned a predetermined distance therefrom, each probe extending away from said probe tip toward a solder point on said probe card;
(f) electrical insulating means securing said probes to said support surface to electrically insulate said probes from said ground strip and to maintain said predetermined distance; and
(g) sleeve means on each of said probes insulating said probe from said ground plane as said probe extends from said ground strip to said solder point.

12. The combination set forth in claim 11 wherein said circuit board includes an opening extending therethrough and wherein said ground strip is positioned in said opening adjacent the ground plane.

13. The combination set forth in claim 12 wherein said electrical insulating means comprises an encapsulant for encapsulating said probes and securing said probes to said support surface at a predetermined distance therefrom.

* * * * *